United States Patent
Yoo

(10) Patent No.: US 10,145,880 B2
(45) Date of Patent: Dec. 4, 2018

(54) ELECTRIC FIELD SENSOR AND IMAGE FORMING APPARATUS THEREWITH

(71) Applicant: KYOCERA Document Solutions Inc., Osaka (JP)

(72) Inventor: Keunmoon Yoo, Osaka (JP)

(73) Assignee: KYOCERA DOCUMENT SOLUTIONS INC., Osaka (JP)

( * ) Notice: Subject to any disclaimer, the term of this patent is extended or adjusted under 35 U.S.C. 154(b) by 0 days.

(21) Appl. No.: 15/901,524

(22) Filed: Feb. 21, 2018

(65) Prior Publication Data

US 2018/0252756 A1    Sep. 6, 2018

(30) Foreign Application Priority Data

Mar. 2, 2017    (JP) ................. 2017-039307

(51) Int. Cl.
| | |
|---|---|
| *G01R 29/12* | (2006.01) |
| *H04N 1/00* | (2006.01) |
| *H02N 2/02* | (2006.01) |
| *G03G 15/02* | (2006.01) |
| *G03G 15/01* | (2006.01) |
| *H04N 1/29* | (2006.01) |

(52) U.S. Cl.
CPC ......... *G01R 29/12* (2013.01); *G03G 15/0105* (2013.01); *G03G 15/0266* (2013.01); *H02N 2/026* (2013.01); *H04N 1/00015* (2013.01); *H04N 1/00034* (2013.01); *H04N 1/00058* (2013.01); *H04N 1/29* (2013.01); *H04N 2201/0082* (2013.01)

(58) Field of Classification Search
CPC . G03G 15/0266; G03G 15/5037; G01R 29/12
See application file for complete search history.

(56) References Cited

U.S. PATENT DOCUMENTS

| | | | |
|---|---|---|---|
| 7,489,135 B2 * | 2/2009 | Ichimura ................ | G01R 29/12 257/314 |
| 2006/0186898 A1 * | 8/2006 | Ichimura .............. | G01R 15/165 324/663 |
| 2008/0150543 A1 | 6/2008 | Masubuchi et al. .......... | 324/452 |

FOREIGN PATENT DOCUMENTS

JP    2008-233187 A    10/2008

\* cited by examiner

*Primary Examiner* — Erika J Villaluna
(74) *Attorney, Agent, or Firm* — Stein IP, LLC

(57) ABSTRACT

An electric field sensor has a semiconductor stack, a first electrode, and a second electrode. The semiconductor stack includes a first semiconductor layer of a first conductive type and a second semiconductor layer of a conductive type opposite to the first conductive type stacked on the first semiconductor layer. The first electrode is arranged on one side of the semiconductor stack in the lamination direction. The second electrode is arranged on the other side of the semiconductor stack in the lamination direction. The electric field sensor detects the intensity of an electric field in the direction orthogonal to the lamination direction based on a current passing through the semiconductor stack.

3 Claims, 5 Drawing Sheets

ELECTRIC FIELD SENSOR AND IMAGE FORMING APPARATUS THEREWITH

INCORPORATION BY REFERENCE

This application is based upon and claims the benefit of priority from the corresponding Japanese Patent Application No. 2017-039307 filed on Mar. 2, 2017, the entire contents of which are incorporated herein by reference.

BACKGROUND

The present disclosure relates to an electric field sensor and to an image forming apparatus provided with the electric field sensor. More particularly, the present disclosure relates to an electric field sensor including a first semiconductor layer of a first conductive type and a second semiconductor layer of a second conductive type stacked on the first semiconductor layer, and to an image forming apparatus provided with such an electric field sensor.

In conventional image forming apparatuses utilizing electrophotography, an image forming process proceeds as follows. An image carrying member such as a photosensitive drum having been electrostatically charged uniformly by a charging device is irradiated with laser light from an exposing device to form an electrostatic latent image, and toner is attached to the electrostatic latent image by a developing device to form a toner image. Then, the toner image is transferred to a sheet (recording medium), and is then subjected to fixing.

In such image forming apparatuses, a surface potential sensor is provided for detecting the surface potentials on a photosensitive drum, an intermediate transfer belt, a developing roller, and the like. Then, based on the result of detection by the surface potential sensor, the charging bias of a charging device, the developing bias of a developing device, and the like are adjusted.

In typical surface potential sensors, the surface potential on a measurement target is calculated by measuring the amount of electric charge moving through a conductive member when the conductive member is brought near an electrostatically charged object (measurement target). Electric charge is caused to move by variation in the intensity of an electric field which the conductive member receives from the electrostatically charged object; thus, when the intensity of the electric field does not vary (for example, when the conductive member is fixed), the detection voltage drops quickly due to the leakage of electric charge. Thus, by periodically varying the intensity of the electric field by use of a tuning fork or the like, a current (the amount of electric charge moving) is detected.

SUMMARY

According to one aspect of the present disclosure, an electric field sensor includes a semiconductor stack, a first electrode, and a second electrode. The semiconductor stack includes a first semiconductor layer of a first conductive type and a second semiconductor layer of a second conductive type which is a conductive type opposite to the first conductive type. The second semiconductor layer is stacked on the first semiconductor layer. The first electrode is arranged on one side of the semiconductor stack in the lamination direction. The second electrode is arranged on the other side of the semiconductor stack in the lamination direction. The electric field sensor detects the intensity of the electric field in the direction orthogonal to the lamination direction based on a current passing through the semiconductor stack.

Further features and advantages of the present disclosure will become apparent from the description of embodiments given below.

DETAILED DESCRIPTION

Hereinafter, embodiments of the present disclosure will be described with reference to the accompanying drawings.

First Embodiment

Figure 1:
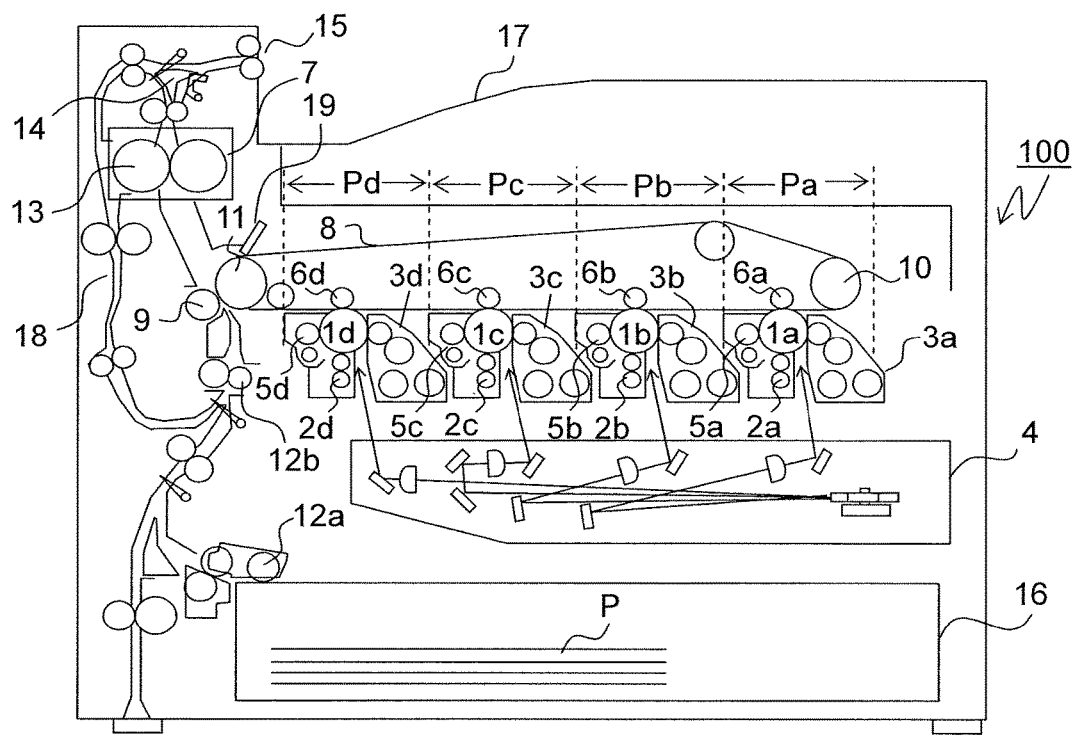
FIG. 1 is a schematic sectional view of a color printer incorporating surface potential sensors according to a first embodiment of the present disclosure.

FIG. 1 is a schematic sectional view of an image forming apparatus incorporating surface potential sensors 50a to 50d according to a first embodiment of the present disclosure, here showing a tandem-type color printer. Inside the apparatus main body of the color printer (image forming apparatus) 100, four image forming parts Pa, Pb, Pc and Pd are arranged in this order from the upstream side (the right side in FIG. 1) of an intermediate transfer belt 8 in its traveling direction. These image forming parts Pa to Pd are provided to correspond to images of four different colors (cyan, magenta, yellow, and black) respectively, and sequentially form cyan, magenta, yellow, and black images respectively, each through the processes of electrostatic charging, exposure to light, image development, and image transfer.

In these image forming parts Pa to Pd, there are respectively arranged photosensitive drums (electrostatic latent image carrying members) 1a, 1b, 1c and 1d that carry visible images (toner images) of the different colors. Moreover, the intermediate transfer belt 8 that rotates in the clockwise direction in FIG. 1 is arranged next to the image forming parts Pa to Pd.

When image data is fed in from a host device such as a personal computer, first, by charging devices 2a to 2d, the surfaces of the photosensitive drums 1a to 1d are electrostatically charged uniformly. Then, through irradiation by an exposing device 4 with light based on the image data, electrostatic latent images based on the image data are formed on the photosensitive drums 1a to 1d respectively. Developing devices 3a to 3d are charged with predetermined amounts of two-component developer (hereinafter, also referred to simply as developer) containing magnetic carrier and toner of different colors, namely cyan, magenta, yellow, and black respectively, fed from toner containers (unillustrated). The toner contained in the developer is fed from the developing devices 3a to 3d to the photosensitive drums 1a to 1d having the electrostatic latent images formed on them, and electrostatically attaches to them. Thereby, toner images are formed based on the electrostatic latent images formed by exposure to light from the exposing device 4.

Then, an electric field is applied, by primary transfer rollers 6a to 6d, between the primary transfer rollers 6a to 6d and the photosensitive drums 1a to 1d with a predetermined transfer voltage. Thereby, the cyan, magenta, yellow, and black toner images on the photosensitive drums 1a to 1d are primarily transferred to the intermediate transfer belt 8, which is wound around a driving roller 11 and a following roller 10 under tension. Toner and the like that remain on the surfaces of the photosensitive drums 1a to 1d after primary transfer are removed by cleaning devices 5a to 5d.

Transfer sheets P to which toner images are to be transferred are stored in a sheet cassette 16 arranged in a lower part inside the color printer 100. A transfer sheet P is conveyed, via a sheet feeding roller 12a and a registration roller pair 12b, with predetermined timing, to a nip (secondary transfer nip) between a secondary transfer roller 9, which is arranged next to the intermediate transfer belt 8, and the intermediate transfer belt 8. At the secondary transfer nip, the toner images on the surface of the intermediate transfer belt 8 are transferred to the sheet P. After the transfer, toner left unused on the intermediate transfer belt 8 is removed by a belt cleaning device 19. The transfer sheet P having the toner images secondarily transferred to it is conveyed to a fixing part 7.

The transfer sheet P conveyed to the fixing part 7 is then heated and pressed there by a fixing roller pair 13 so that the toner images are fixed to the surface of the transfer sheet P to form a predetermined full-color image. The transfer sheet P having the full-color image formed on it is discharged as it is (or after being distributed by a branching part 14 into a reverse conveyance passage 18 and having images formed on both sides of it) onto a discharge tray 17 by a discharge roller pair 15.

Figure 2:
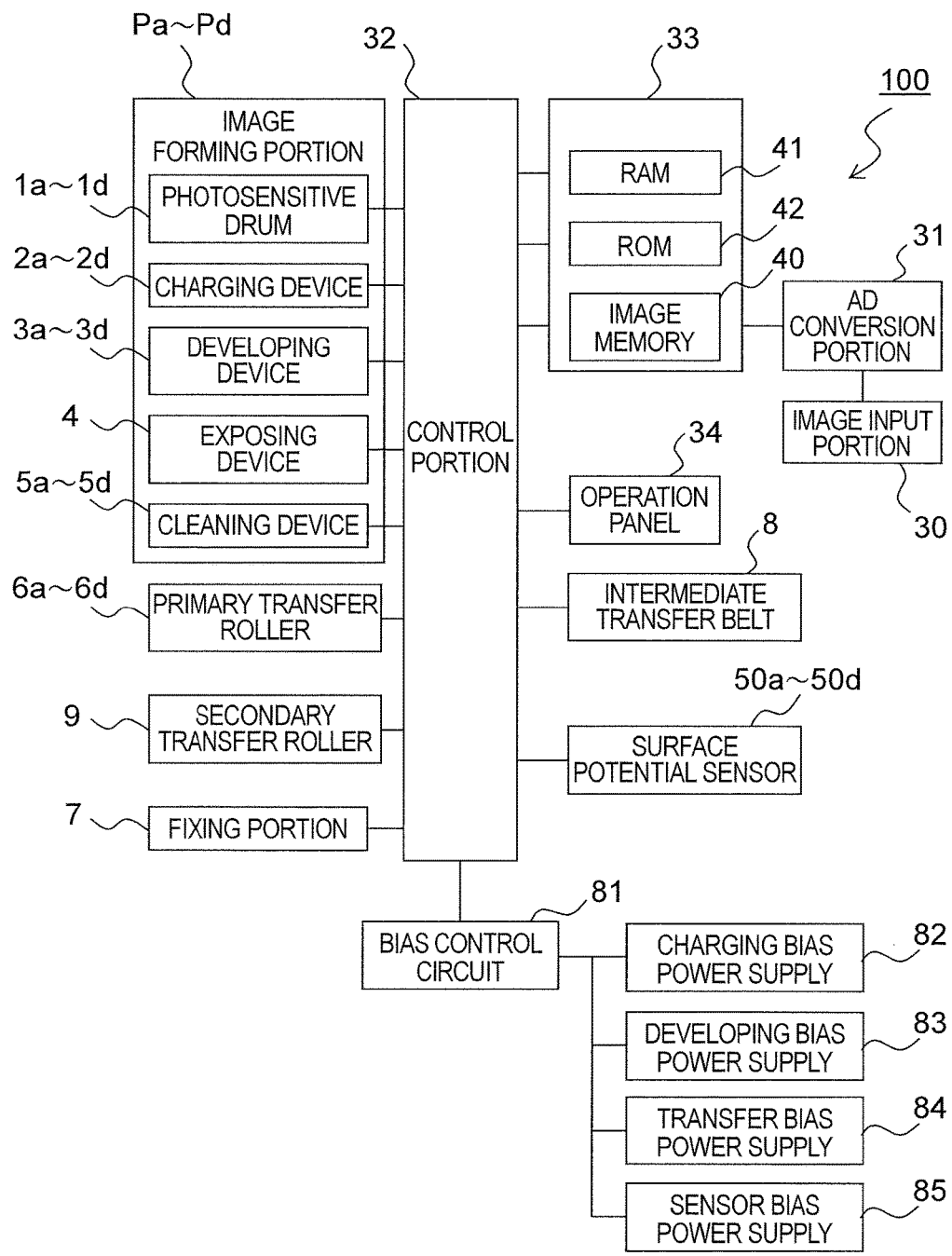
FIG. 2 is a block diagram showing controlling channels in the color printer according to the first embodiment of the present disclosure.

FIG. 2 is a block diagram showing controlling channels in the color printer 100 according to this embodiment. Such components as find their counterparts in FIG. 1 are identified by the same reference signs, and no overlapping description will be repeated. The color printer 100 includes the image forming parts Pa to Pd, an image input part 30, an AD conversion part 31, a controller 32, a storage 33, an operation panel 34, the fixing part 7, the intermediate transfer belt 8, the surface potential sensors (electric field sensors) 50a to 50d, a bias control circuit 81, and the like.

The image input part 30 is a receiver which receives image data transmitted from a host device such as a personal computer. The image signal received in the image input part 30 is converted into a digital signal in the AD converter 31, and is then fed out to an image memory 40 in the storage 33.

The storage 33 includes the image memory 40, RAM 41, and ROM 42. The image memory 40 stores the image signal fed in from the image input part 30 and then converted into a digital signal in the AD converter 31, and feeds it out to the controller 32. The RAM 41 and the ROM 42 store processing programs, processed data, and the like for the controller 32.

In the RAM 41 (or ROM 42), there are stored data and the like required for toner supply control and charging bias correction control, of which the latter will be described later.

The operation panel 34 is composed of an operation part which includes a plurality of operation keys and a display part which displays setting conditions and the status of the apparatus (none of these is illustrated), and permits a user to make settings for printing conditions and the like.

The controller 32 is, for example, a central processing unit (CPU), and generally controls, according to set programs, the image input part 30, the image forming parts Pa to Pd, the fixing part 7, conveyance of the sheets P from the sheet cassette 16 (see FIG. 1), and the like, and also converts an image signal fed in from the image input part 30 into image data through variable magnification processing or gradation processing as necessary. The exposing device 4 irradiates the photosensitive drums 1a to 1d with laser light based on the processed image data to form electrostatic latent images thereon.

The controller 32 also has a function of performing charging bias correction for each color. This is achieved in the following manner. When a mode (hereinafter, referred to as a charging bias correction mode) for properly setting the surface potentials on the photosensitive drums (measurement targets) 1a to 1d is set through key operation or the like on the operation panel 34, the controller 32 receives output signals from the surface potential sensors 50a to 50d, then determines the surface potentials on the photosensitive drums 1a to 1d based on the surface potential data stored in the storage 33, then compares them with previously set surface potentials, and then adjusts the charging biases of the charging devices 2a to 2d. Here, the charging bias correction mode may be set automatically when the power to the color printer 100 is turned on or when image formation on a predetermined number of sheets is completed.

The bias control circuit 81 is connected to a charging bias power supply 82, a developing bias power supply 83, a transfer bias power supply 84, and a sensor bias power supply 85, and serves to operate these power supplies according to an output signal from the controller 32. These power supplies apply predetermined biases, according to a control signal from the bias control circuit 81, to the charging devices 2a to 2d, the developing devices 3a to 3d, the primary transfer rollers 6a to 6d and the secondary transfer roller 9, and the surface potential sensors 50a to 50d respectively.

Figure 3:
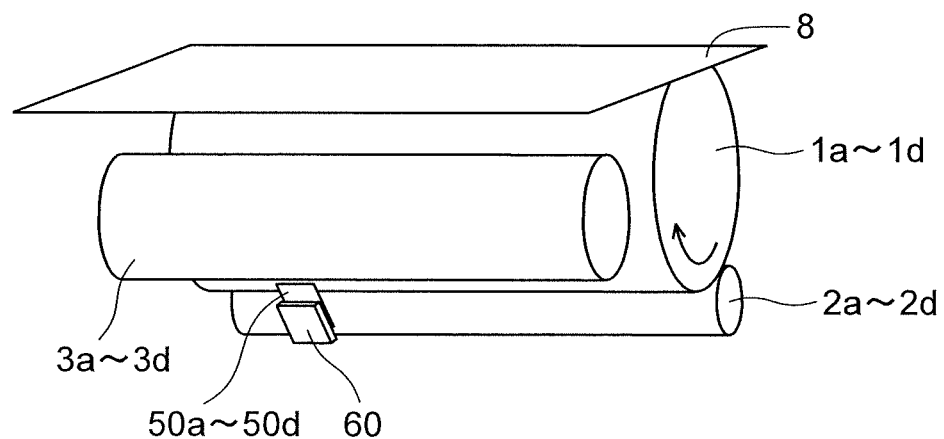
FIG. 3 is a perspective view showing a structure around a surface potential sensor according to the first embodiment of the present disclosure.

The surface potential sensors 50a to 50d each transmit to the controller 32 an output signal that reflects the result of detection. As shown in FIG. 3, the surface potential sensors 50a to 50d are each fitted to a supporting member 60, and are arranged opposite the surfaces of the photosensitive drums 1a to 1d respectively. The surface potential sensors 50a to 50d are arranged, with respect to the rotation direction of the photosensitive drums 1a to 1d, on the downstream side of the charging devices 2a to 2d and on the upstream side of the developing devices 3a to 3d.

Figure 4:
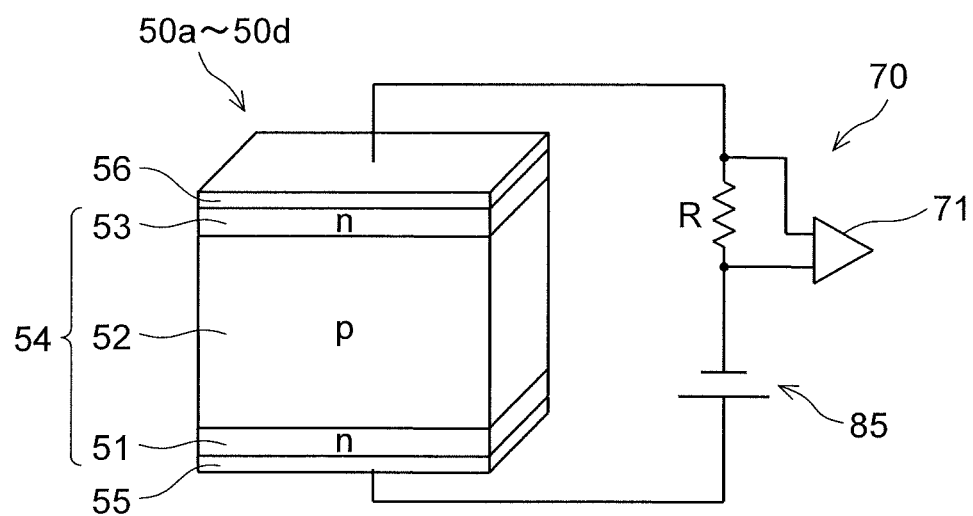
FIG. 4 is a diagram showing a circuit configuration including the surface potential sensor according to the first embodiment of the present disclosure, a sensor bias power supply, and a current detecting part.

As shown in FIG. 4, the surface potential sensors 50a to 50d are sensors which detect the surface potentials on the photosensitive drums 1a to 1d (see FIG. 3), and each include a semiconductor stack 54 having a first semiconductor layer 51 of the n type (first conductive type), a second semiconductor 52 of the p type (second conductive type) stacked on the first semiconductor layer 51, and a third semiconductor layer 53 of the n type stacked on the second semiconductor layer 52.

The surface potential sensors 50a to 50d each further include a first electrode 55 comprising a metal layer arranged on one side (the lower side in FIG. 4) of the semiconductor stack 54 in the lamination direction and a second electrode 56 comprising a metal layer arranged on the other side (the upper side in FIG. 4) of the semiconductor stack 54 in the lamination direction. The first electrode 55 is in ohmic contact with the first semiconductor layer 51, and the second electrode 56 is in ohmic contact with the third semiconductor layer 53.

Between the first electrode 55 and the second electrode 56, a predetermined voltage is applied by the sensor bias power supply 85. The sensor bias power supply 85 is so configured that the level of the voltage that it applies between the first electrode 55 and the second electrode 56 is adjustable.

Figure 5:
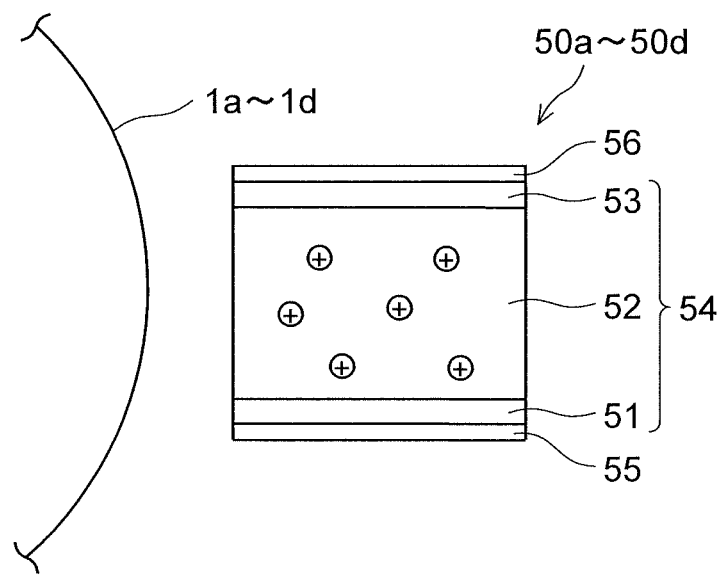
FIG. 5 is a diagram showing a state where no inversion layer is formed in a second semiconductor layer of the surface potential sensor according to the first embodiment of the present disclosure.

As shown in FIG. 5, the surface potential sensors 50a to 50d are arranged such that the lamination direction (the up-down direction in FIG. 5) of the semiconductor stack 54 is orthogonal to the direction from the photosensitive drums 1a to 1d to the semiconductor stack 54. That is, the surface potential sensors 50a to 50d are arranged such that a side surface of the semiconductor stack 54 faces the photosensitive drums 1a to 1d. The distance between the surface potential sensors 50a to 50d and the photosensitive drums 1a to 1d is set, for example, at 1 mm to 2 mm.

Figure 6:
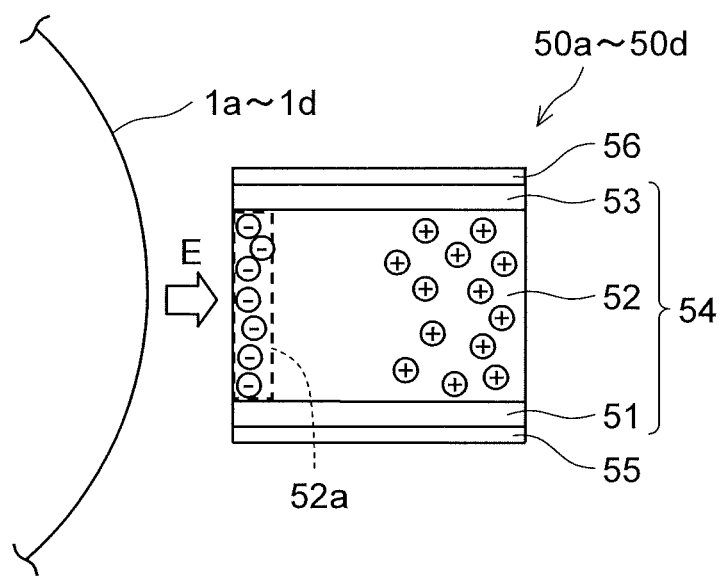
FIG. 6 is a diagram showing a state where an inversion layer is formed in the second semiconductor layer of the surface potential sensor according to the first embodiment of the present disclosure.

When the photosensitive drums 1a to 1d have a surface potential of zero, no current passes through the surface potential sensors 50a to 50d. On the other hand, when the surfaces of the photosensitive drums 1a to 1d are electrostatically charged positively, as shown in FIG. 6, by the action of an electric field E in the direction orthogonal to the lamination direction, electrons are pulled toward a left end part of the second semiconductor layer 52 (toward the photosensitive drums 1a to 1d), thereby forming an inversion layer 52a. The thickness (the length in the left-right direction in FIG. 6) of the inversion layer 52a varies with the intensity of the electric field E.

Then, with a predetermined voltage applied to the surface potential sensors 50a to 50d from the sensor bias power supply 85, a current commensurate with the thickness of the inversion layer 52a (that is, a current commensurate with the intensity of the electric field E) passes via the inversion layer 52a between the first semiconductor layer 51 and the third semiconductor layer 53.

By detecting the current by a current detecting part 70 (see FIG. 4), it is possible to detect the intensity of the electric field E. As shown in FIG. 4, the current detecting part 70 has a resistor R and an amplifier 71, and outputs to the controller 32 a detection signal corresponding to the amount of the current passing through the surface potential sensors 50a to 50d.

The controller 32 is configured to calculate the intensity of the electric field E based on the detection signal from the current detecting part 70. The controller 32 is also configured to calculate the surface potentials on the photosensitive drums 1a to 1d based on the calculated intensity of the electric field E and the distance between the photosensitive drums 1a to 1d and the surface potential sensors 50a to 50d. The controller 32 is also configured to correct the voltages applied to the charging devices 2a to 2d based on the calculated surface potentials (actual surface potentials) on the photosensitive drums 1a to 1d and the previously set surface potentials. Thus, it is possible to correct the surface potentials on the photosensitive drums 1a to 1d to the previously set surface potentials.

Detection errors may occur due to the characteristics of the surface potential sensors 50a to 50d and errors in their fitting angles and fitting positions. In this case, by adjusting the level of the voltage applied between the first electrode 55 and the second electrode 56, it is possible to reduce the detection errors.

In this embodiment, as described above, by the action of the electric field E in the direction orthogonal to the lamination direction of the semiconductor stack 54, an uneven distribution of electrons (or positive holes) occurs and forms the inversion layer 52a inside the second semiconductor layer 52. Then, with a voltage applied between the first electrode 55 and the second electrode 56, a current passes through the semiconductor stack 54 via the inversion layer 52a. Thus, by detecting the current passing through the semiconductor stack 54, it is possible to detect the intensity of the electric field E. Thus, with the surface potential sensors 50a to 50d according to the present disclosure, there is no need to use a tuning fork or the like for detecting the intensity of the electric field E; this helps achieve size reduction.

According to the intensity of the electrostatic field E, the thickness of the inversion layer 52a varies, and accordingly the amount of current passing through the semiconductor stack 54 varies. Thus, based on the amount of current passing through the semiconductor stack 54, it is possible to detect the intensity of the electric field E.

As described above, the semiconductor stack 54 includes the first semiconductor layer 51 of the n type, the second semiconductor layer 52 of the p type, and the third semiconductor layer 53 of the n type. The first electrode 55 is electrically connected to the first semiconductor layer 51, and the second electrode 56 is electrically connected to the third semiconductor layer 53. Thus, it is possible to obtain the surface potential sensors 50a to 50d with a simple configuration.

As described above, the surface potential sensors 50a to 50d are arranged such that the lamination direction is orthogonal to the direction from the photosensitive drums 1a to 1d to the semiconductor stack 54. Thus, it is possible to easily detect the surface potentials on the photosensitive drums 1a to 1d based on the intensity of the electric field E (the result of detection by the surface potential sensors 50a to 50d) and the distance from the semiconductor stack 54 to the photosensitive drums 1a to 1d.

As described above, the level of the voltage applied to the first electrode 55 and the second electrode 56 of the sensor bias power supply 85 can be adjusted based on the characteristics, fitting angles, and fitting positions of the surface potential sensors 50a to 50d. Thus, it is possible, by use of the voltage applied to the first electrode 55 and the second electrode 56, to reduce detection errors resulting from the characteristics of the surface potential sensors 50a to 50d and errors in their fitting angles and fitting positions. It is also possible, by adjusting the level of the voltage applied to the first electrode 55 and the second electrode 56, to adjust the sensitivity of the surface potential sensors 50a to 50d.

Second Embodiment

Figure 7:
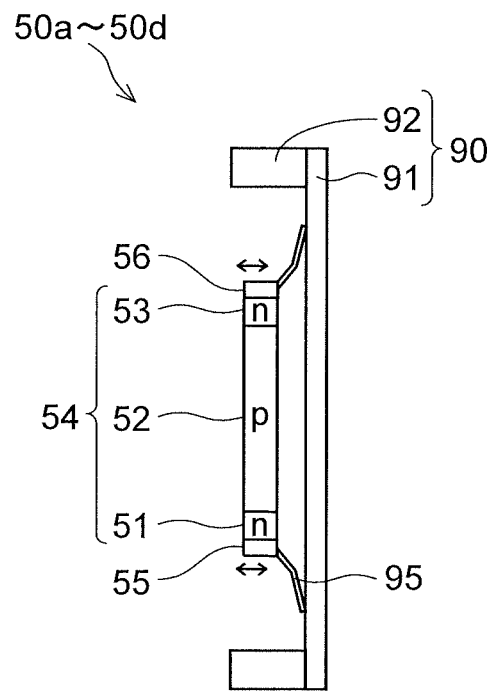
FIG. 7 is a sectional view showing a structure of a surface potential sensor according to a second embodiment of the present disclosure.

As shown in FIG. 7, surface potential sensors 50a to 50d according to a second embodiment of the present disclosure each includes a base body 90 having a circuit board 91 on which the semiconductor stack 54 is mounted and to which the semiconductor stack 54 is electrically connected and a frame part 92 which is arranged upright in a peripheral edge part of the circuit board 91. The semiconductor stack 54 is mounted on the circuit board 91 via a plurality of piezoelectric elements (movable parts) 95 such that the lamination direction (the up-down direction in FIG. 7) is parallel to the circuit board 91.

The piezoelectric elements 95 are formed, for example, by MEMS (microelectromechanical system) technology. The piezoelectric elements 95 are configured to receive a voltage from an unillustrated piezoelectric bias applying part. When an AC voltage is applied to the piezoelectric elements 95, the semiconductor stack 54 vibrates in the direction orthogonal to the lamination direction (the left-right direction in FIG. 7). The piezoelectric elements 95 are formed with high precision, and thus the vibration width of the semiconductor stack 54 can be set with high precision.

Here, vibrating the semiconductor stack 54 while the surfaces of the photosensitive drums 1a to 1d are electrostatically charged positively causes the distance from the photosensitive drums 1a to 1d to the semiconductor stack 54 to vary, and accordingly the intensity of the electric field E acting on the semiconductor stack 54 varies. Thus, the thickness of the inversion layer 52a varies, and the amount of current passing through the surface potential sensors 50a to 50d varies. That is, the intensity of the electric field E detected by the surface potential sensors 50a to 50d varies.

Figure 8:
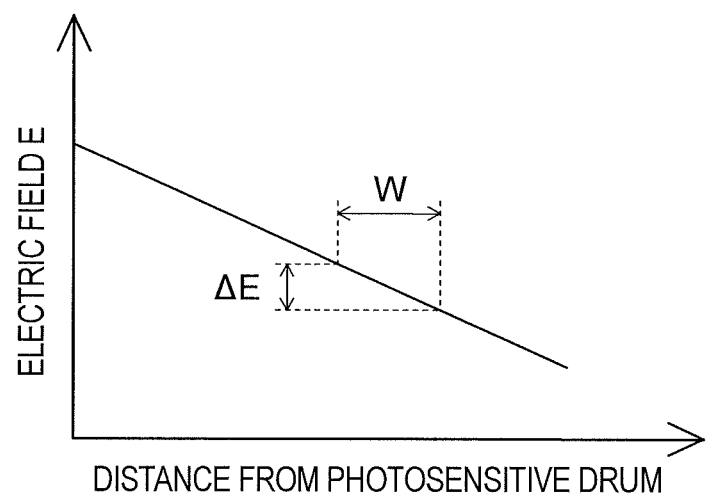
FIG. 8 is a diagram showing the relationship between a distance from a photosensitive drum and the intensity of an electric field.

The controller 32 is configured to calculate variation in the intensity of the electric field E from the difference between the maximum value and the minimum value of the intensity of the electric field E. The controller 32 is also configured to calculate the surface potentials on the photosensitive drums 1a to 1d based on the variation in the intensity of the electric field E and the vibration width of the semiconductor stack 54. Specifically, as shown in FIG. 8, based on the vibration width W of the semiconductor stack 54 and the variation ΔE in the intensity of the electric field E, the ratio of change in the electric field E (ΔE/W) is calculated by the controller 32. The ratio of change in the electric field E does not depend on the distance from the photosensitive drums 1a to 1d to the semiconductor stack 54, and is determined by the surface potentials of the photosensitive drums 1a to 1d. Thus, the controller 32 can calculate the surface potentials on the photosensitive drums 1a to 1d based on the ratio of change in the electric field E.

Otherwise, the structure in the second embodiment is similar to that in the above-described first embodiment.

In this embodiment, as described above, the piezoelectric elements 95 are provided which vibrate the semiconductor stack 54 in the direction orthogonal to the lamination direction. Thus, even when an error occurs in the distance between the potential sensors 50a to 50d and the photosensitive drums 1a to 1d due to a fitting error of the potential sensors 50a to 50d, it is possible to detect the surface potentials on the photosensitive drums 1a to 1d based on the ratio of change in the electric field E (ΔE/W).

As described above, the movable parts which vibrate the semiconductor stack 54 are formed by the piezoelectric elements 95. This makes it possible to form the movable parts (piezoelectric elements 95) small, and thus to prevent an undue increase in the size of the surface potential sensors 50a to 50d.

Otherwise, the effects of the second embodiment is similar to those of the above-described first embodiment.

It should be understood that the embodiments disclosed herein are in every aspect illustrative and not restrictive. The scope of the present disclosure is defined not by the description of embodiments given above but by the appended claims, and encompasses many modifications and variations made in the sense and scope equivalent to those of the claims.

For example, the present disclosure is applicable to devices other than image forming apparatuses.

Although the above-described embodiments deal with an example where the first semiconductor layer 51, the second semiconductor layer 52, and the third semiconductor layer 53 comprise semiconductor layers of the n-type, the p-type, and n-type respectively, when a measurement target is electrostatically charged negatively, the first semiconductor layer 51, the second semiconductor layer 52, and the third semiconductor layer 53 may comprise semiconductor layers of the p-type, the n-type, and the p-type respectively.

Although the above-described embodiments deal with an example where the semiconductor stack 54 includes the first semiconductor layer 51, the second semiconductor layer 52, and the third semiconductor 53, this is in no way meant to limit the present disclosure. For example, the semiconductor 54 may include the first semiconductor layer 51 and the second semiconductor layer 52, and the first electrode 55 and the second electrode 56 may be electrically connected to the first semiconductor layer 51 and the second semiconductor layer 52 respectively.

Although the above-described embodiments deal with an example where the photosensitive drums 1a to 1d are used as measurement targets, this is in no way meant to limit the present disclosure. For example, the intermediate transfer belt 8 and a developing roller may be used as measurement targets. For another example, components other than those of image forming apparatuses may be used as measurement targets.

Although the above-described second embodiment deals with an example where the semiconductor lamination 54 is vibrated in the direction orthogonal to the lamination direction, this is in no way meant to limit the present disclosure. As long as the intensity of the electric field E varies periodically, the semiconductor stack 54 may be vibrated in any direction other than the direction orthogonal to the lamination direction.

Although the above-described second embodiment deals with an example where the movable part comprises the piezoelectric element 95, this is in no way meant to limit the present disclosure. The movable part may comprise any element other than the piezoelectric element 95. The movable part may be formed by any method other than MEMS technology.

What is claimed is:

1. An image forming apparatus comprising:
   an electric field sensor; and
   a photosensitive drum on which a surface potential is detected by the electric field sensor, wherein
   the electric field sensor includes:
   a semiconductor stack including a first semiconductor layer of a first conductive type and a second semiconductor layer of a second conductive type which is a conductive type opposite to the first conductive type, the second semiconductor layer being stacked on the first semiconductor layer;
   a first electrode arranged on one side of the semiconductor stack in a lamination direction;
   a second electrode arranged on another side of the semiconductor stack in the lamination direction;
   a circuit board on which the semiconductor stack is mounted; and
   a plurality of piezoelectric elements provided on the circuit board, the plurality of piezoelectric elements supporting the semiconductor stack such that the lamination direction of the semiconductor stack is parallel to the circuit board, the plurality of piezoelectric elements vibrating the semiconductor stack in a direction orthogonal to the lamination direction;

wherein the electric field sensor is arranged such that the lamination direction is orthogonal to a direction from the photosensitive drum to the semiconductor stack, and the surface potential on the photosensitive drum is calculated based on a vibration width of the semiconductor stack and variation in an intensity of an electric field detected by the electric field sensor while the semiconductor stack is vibrated by the plurality of piezoelectric elements.

2. The image forming apparatus of claim 1, wherein the semiconductor stack further includes a third semiconductor layer of the first conductive type stacked on the second semiconductor layer, the first electrode is electrically connected to the first semiconductor layer, and the second electrode is electrically connected to the third semiconductor layer.

3. The image forming apparatus of claim 1, further comprising a voltage applying part which applies a voltage to the first electrode and the second electrode, wherein the voltage applied to the first electrode and the second electrode from the voltage applying part is adjustable based on at least one of characteristics, fitting angle, and fitting position of the electric field sensor.

\* \* \* \* \*